(12) United States Patent
Chiola et al.

(10) Patent No.: US 8,003,456 B2
(45) Date of Patent: Aug. 23, 2011

(54) METHOD FOR PRODUCING A SEMICONDUCTOR COMPONENT

(75) Inventors: Davide Chiola, Villach St. Georgen (AT); Carsten Schaeffer, Sattendorf-Annenheim (AT)

(73) Assignee: Infineon Technologies Austria AG, Villach (AT)

( * ) Notice: Subject to any disclaimer, the term of this patent is extended or adjusted under 35 U.S.C. 154(b) by 195 days.

(21) Appl. No.: 12/145,808

(22) Filed: Jun. 25, 2008

(65) Prior Publication Data

US 2008/0315363 A1    Dec. 25, 2008

(30) Foreign Application Priority Data

Jun. 25, 2007  (DE) .......................... 10 2007 029 121

(51) Int. Cl.
*H01L 21/8238*  (2006.01)
(52) U.S. Cl. ........ 438/206; 438/164; 438/217; 438/270; 257/E21.058; 257/E21.41; 257/E21.633
(58) Field of Classification Search .................. 438/170, 438/156, 173, 174, 194, 196, 206, 272, 524; 257/E21.057, E21.058
See application file for complete search history.

(56) References Cited

U.S. PATENT DOCUMENTS

| | | | |
|---|---|---|---|
| 5,801,075 A * | 9/1998 | Gardner et al. | 438/197 |
| 6,201,278 B1 * | 3/2001 | Gardner et al. | 257/330 |
| 6,392,273 B1 | 5/2002 | Chang | |
| 6,756,612 B1 * | 6/2004 | Nemati et al. | 257/156 |
| 2003/0094624 A1 | 5/2003 | Hshieh et al. | |
| 2004/0227182 A1 * | 11/2004 | Darwish et al. | 257/330 |
| 2005/0263853 A1 | 12/2005 | Tomomatsu et al. | |
| 2008/0035987 A1 * | 2/2008 | Hebert | 257/330 |

FOREIGN PATENT DOCUMENTS

| | | |
|---|---|---|
| DE | 103 19 515 B4 | 11/2004 |
| DE | 10 2005 004 354 A1 | 8/2006 |

OTHER PUBLICATIONS

Laska, T. et al.; "Field Stop IGBTs with Dynamic Clamping Capability—A New Degree of Freedom for Future Inverter Designs?"; EPE 2005—Dresden—ISBN: 90-75815-08-5, pp. 1-8.

* cited by examiner

*Primary Examiner* — Cheung Lee
(74) *Attorney, Agent, or Firm* — Dickstein Shapiro LLP

(57) ABSTRACT

A method for producing a semiconductor component is proposed. The method includes providing a semiconductor body having a first surface; forming a mask on the first surface, wherein the mask has openings for defining respective positions of trenches; producing the trenches in the semiconductor body using the mask, wherein mesa structures remain between adjacent trenches; introducing a first dopant of a first conduction type using the mask into the bottoms of the trenches; carrying out a first thermal step; introducing a second dopant of a second conduction type, which is complementary to the first conduction type, at least into the bottoms of the trenches; and carrying out a second thermal step.

16 Claims, 13 Drawing Sheets

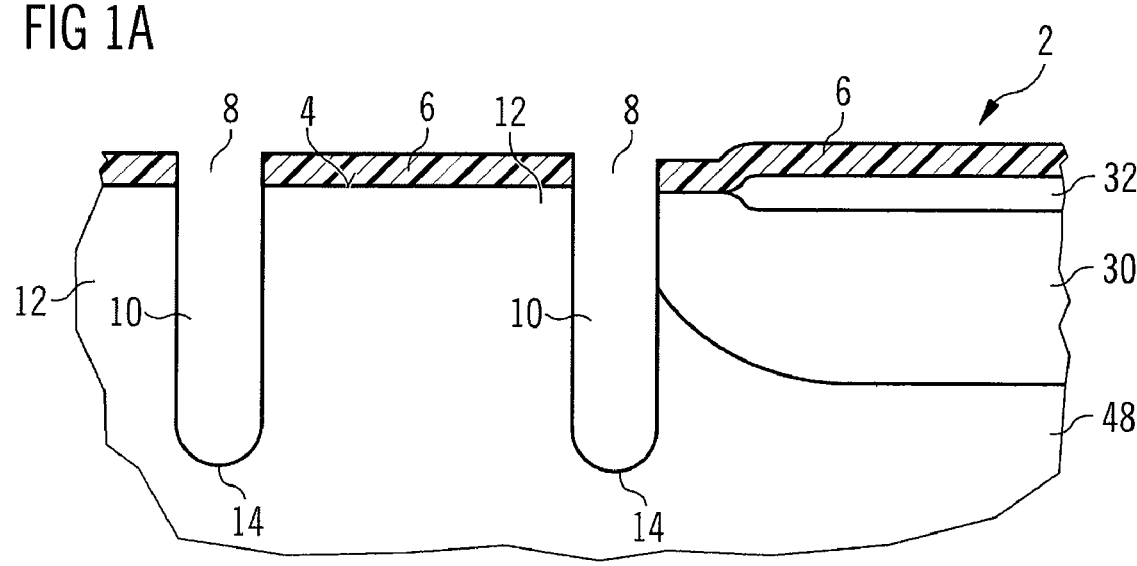
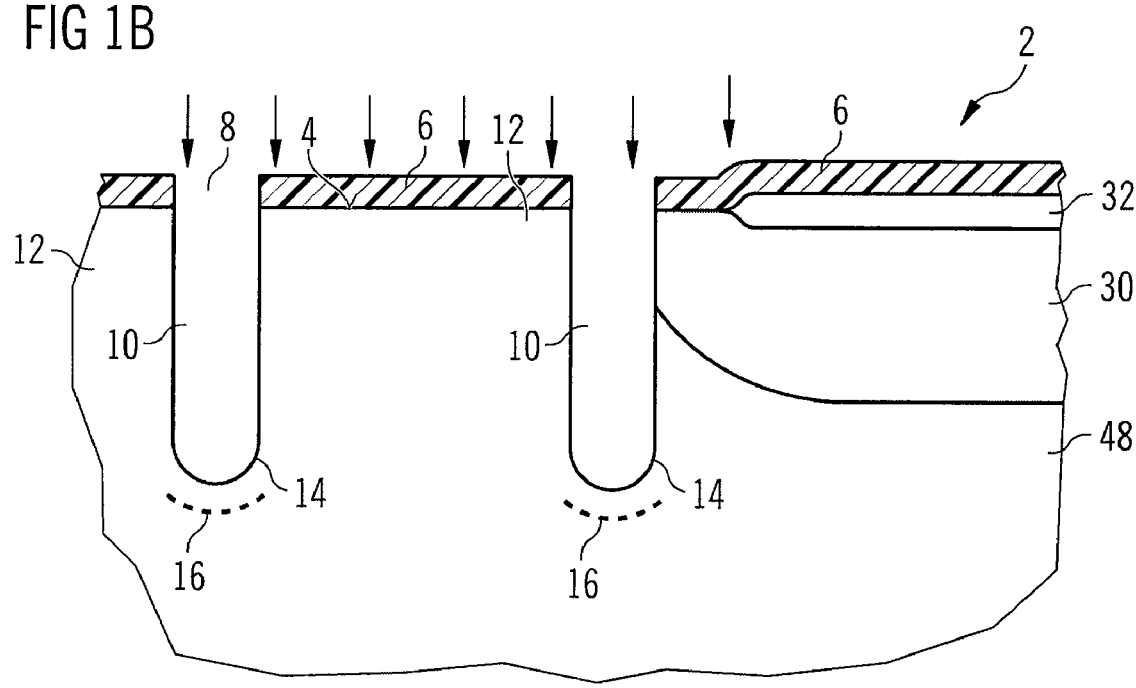

METHOD FOR PRODUCING A SEMICONDUCTOR COMPONENT

CROSS-REFERENCE TO RELATED APPLICATION

This application claims priority to German Patent Application Serial No. 10 2007 029 121.5, which was filed Jun. 25, 2007, and is incorporated herein by reference in its entirety.

BACKGROUND

Power semiconductor components are optimized in particular with regard to their on-resistance Ron and their breakdown strength. Thus, IGBTs (Insulated Gate Bipolar Transistor) having dynamic adaptability have been proposed, for example, which adapt themselves dynamically to voltage spikes that can occur when the component is switched over to the off state. The dynamic adaptability of power semiconductor components extends their permissible area of use (SOA, safe Operating Area) and makes it possible to simplify the driving electronics, that is to say to dispense with active clamping elements and overvoltage protective elements without increasing the total resistance Rt.

BRIEF DESCRIPTION OF THE FIGURES

Embodiments shown in the appended figures are described below, and further advantages and modifications will become apparent from said embodiments. However, the invention is not restricted to the specifically described embodiments, but rather can be modified and altered in a suitable manner. It lies within the scope of the invention to combine individual features and feature combinations from one embodiment with features and feature combinations from another embodiment in a suitable manner in order to attain further embodiments according to the invention.

Embodiments relate generally to semiconductor components. More specifically, the embodiments relate to field effect controllable semiconductor components. They relate especially to power semiconductor components and in particular to field effect semiconductor components with or without a bipolar transistor structure. Further embodiments relate to a method for producing a semiconductor component which is e.g. controllable by the field effect.

FIGS. 1A to 1F show a first embodiment of a method for producing a field effect controllable semiconductor component.

DETAILED DESCRIPTION

Figure 1C:
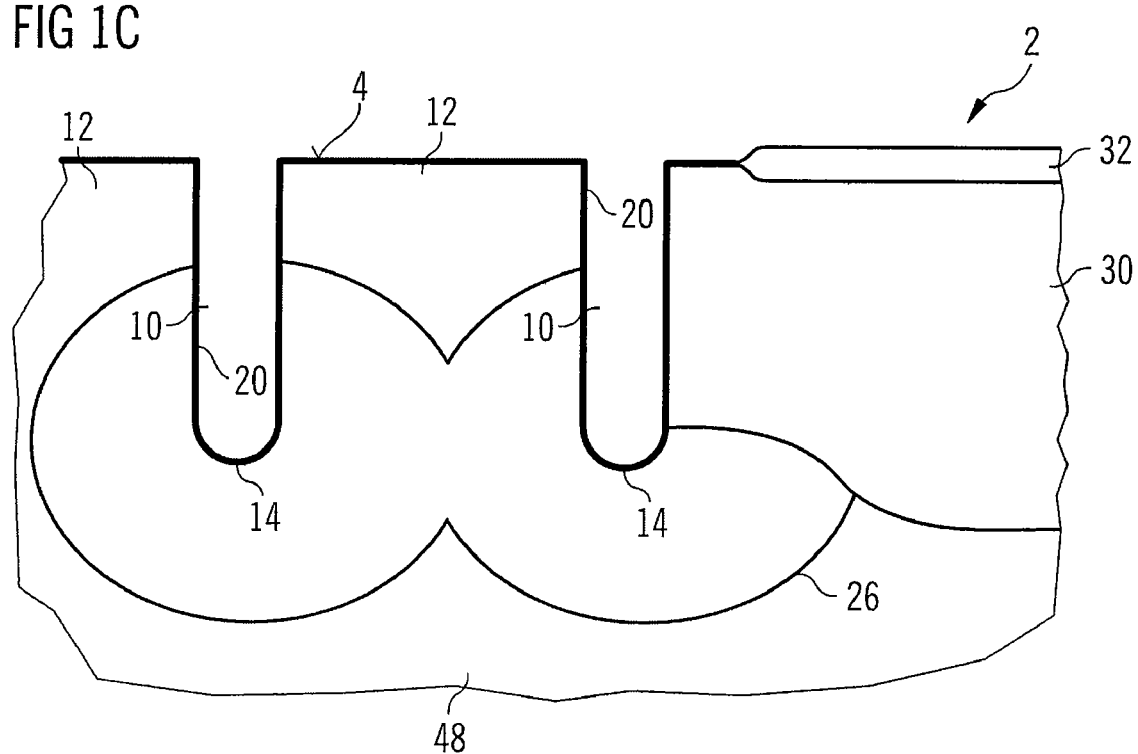

Some embodiments will be explained below. In the context of the present description, "laterally" or "lateral direction" is to be understood to mean a direction or extent running parallel to the lateral extent of a semiconductor material or semiconductor body. A semiconductor body is typically present as a thin wafer or chip and has two surfaces situated on opposite sides, one surface of which is referred to as main surface. The lateral direction thus extends parallel to these surfaces. In contrast thereto, the term "vertically" or "vertical direction" is understood to mean a direction running perpendicular to the main surface and thus to the lateral direction. The vertical direction therefore runs in the thickness direction of the wafer or chip.

The embodiments are predominantly described on the basis of field effect transistors with a bipolar transistor structure, in particular power semiconductor components and specifically IGBTs with a pnp bipolar transistor structure. However, the embodiments are not restricted thereto and can also be formed as power field effect transistors, for example npn field effect transistors. The doping shown in the embodiments can also be correspondingly inverted.

The structures shown in the figures are not depicted as true to scale, but rather serve only to afford a better understanding of the embodiments.

FIGS. 1A to 1F show individual steps of a production method in accordance with a first embodiment. An aim of this method is to produce an n-conducting layer which is buried deep in the semiconductor body and surrounds trenches and in particular the lower region of the trenches including the trench bottoms. Furthermore, p-doped layers are formed which are embedded in the n-doped layer and surround the trench bottoms. What is thereby achieved is that a gate oxide formed at the walls of the trenches is protected, particularly in the region of the trench bottoms, against high electric field strengths that can occur in the off state and when the semiconductor component is switched over to the off state.

The starting point of the method is a semiconductor body 2, for example, which typically includes a weakly doped semiconductor region 48. In some exemplary embodiments, the semiconductor region 48 can typically involve the background doping of the semiconductor body 2, which doping in the present embodiment is weakly n-doped (first conduction type) and has a dopant concentration of approximately $2*10^{13}/cm^3$. Parts of this semiconductor region 48 can subsequently form the drift region or the drift path of the semiconductor component.

An optional deep P-type well 30 can be formed in the semiconductor body 2, which well represents the edge region of the semiconductor component to be formed and surrounds the active region of the semiconductor component. The p-type well 30 can be partly covered with a thermally oxidized optional field oxide 32.

Irrespective of whether or not the p-type well 30 and the field oxide 32 are present, a mask 6 is formed onto a first surface 4 of the semiconductor body 2. The mask 6 can be a hard mask. In order to form the mask 6, by way of example, a TEOS layer is deposited over the whole area and suitably patterned using a resist mask (not shown here), wherein openings 8 that define the position of the later trenches are etched in the TEOS layer as a result. FIG. 1A shows the finished patterned mask 6 with the openings 8.

Trenches 10 are formed in the semiconductor body 2 using the mask 6. For this purpose, by way of example, the semiconductor material of the semiconductor body 2 is etched. The etching is effected selectively with respect to the material of the mask 6 and is typically embodied as anisotropic etching, such that trenches 10 having substantially vertical side walls arise. The trenches 10 are typically etched a few μm deep into the semiconductor body, wherein the trenches 10 can extend down to a depth of approximately 4 μm to approximately 8 μm.

The type of etching, that is to say the etching gas or gases used and also the etching time, depends, inter alia, on the material of the semiconductor body 2 used and the material of the mask 6. In the present embodiment, the semiconductor body 2 is composed of monocrystalline silicon, for example. By way of example, the following etching gases are suitable for the anisotropic etching of silicon: $SF_6$ and HBr. Instead of silicon, however, the semiconductor body 2 can also be composed of other semiconductor materials, for example silicon carbide (SiC), compound semiconductors such as, for example, III-V compound semiconductors and heterostructures of the aforementioned semiconductor materials.

The structure obtained after the etching is shown in FIG. 1A. The semiconductor material of the semiconductor body 2 that has remained between adjacent trenches 10 forms mesa structures 12 there, in which for example the body regions of the semiconductor component are formed in later method steps.

Afterward, a first dopant is introduced, for example implanted, into the bottoms 14 of the trenches 10 using the mask 6. The mask 6 originally provided for the etching of the trenches 10 accordingly also serves as an implantation mask, such that the first dopant 16 in the semiconductor body 2 is only implanted into the bottoms 14 of the trenches 10. This is indicated in FIG. 1B. The first dopant 16 is, like the background doping of the semiconductor body 2, of the first conduction type, that is to say an n-type dopant in the present embodiment. By way of example, phosphorus can be used as the first dopant. The dose can generally lie in a range of approximately $1*10^{12}/cm^2$ to approximately $3*10^{13}/cm^2$. The dose can also lie in the range of approximately $6*10^{12}/cm^2$ to approximately $3*10^{13}/cm^2$. It is likewise possible for the dose even to lie in a range of approximately $8*10^{12}/cm^2$ to approximately $2.5*10^{13}/cm^2$. Arsenic and antimony can also be used instead of phosphorus. Alternatively, the first dopant 16 can also be introduced by means of a furnace process using liquid or solid sources. In the case of phosphorus, this can be effected for example on the basis of $POCl_3$.

The mask 6 is subsequently removed for example by means of wet-chemical etching, for example using buffered HF acid, selectively with respect to the material of the semiconductor body 2. In this case, the etching can be effected in a time-controlled manner, that is to say that an etching with a predetermined etching time or with end point control is carried out. A first thermal step, typically a high-temperature thermal step, is subsequently carried out. The implanted first dopant 16 is at least partly outdiffused by means of this thermal step. Since the first dopant 16 was implanted into the trench bottoms 14, the out diffusion takes place from this region, that is to say that the out diffusion regions that form in the process are formed in the depth of the semiconductor body 2 and typically at a distance from the first surface 4 of the semiconductor body 2. If the first thermal step is carried out for a period of time such that said out diffusion regions merge with one another, this gives rise to a buried and contiguous n-conducting layer surrounding the lower region of the trenches including the bottoms 14. This n-conducting layer, which extends substantially in a lateral direction, is referred to hereinafter as buffer region 26 or buffer layer. The buffer region 26 or the out diffusion regions, as indicated in FIG. 1C, are formed approximately symmetrically with respect to the bottoms 14 in a vertical direction. It goes without saying that subsequent thermal steps can lead to a further out diffusion of the first dopant 16. This further out diffusion is not represented in the subsequent figures, for the sake of simplicity. In this case, the extent of the further outdiffusion is greatly dependent on the temperature and the time duration of the further thermal steps. The out diffusion regions of the first dopant need not necessarily grow together during the first thermal step, however. It is also possible for this not to take place until during subsequent thermal steps. However, the first thermal step is the essential thermal step for forming the separate buffer regions (if merging is not desired) or the continuous buffer region 26 (if the out diffusion leads to merging).

The first thermal step can be carried out for example at a temperature in the range of approximately 1000° C. to approximately 1200° C. and in particular at approximately 1150° C., for approximately 140 minutes. The first thermal step can also be carried out for longer periods of time. If appropriate, other dopants (not shown here), for example for forming field rings in the edge region of the semiconductor body 2, can be outdiffused by means of the first thermal step. In this case, the out diffusion regions can attain an extent of approximately 3 to 4 μm, measured from the trench bottoms 14. The mesa structures 12 have a lateral extent of typically approximately 4 μm to approximately 10 μm. In this case, the dopant concentration of the out diffusion regions or of the buffer region 26 can lie between $4*10^{15}/cm^3$ and approximately $3*10^{16}/cm^3$. It is likewise conceivable for the dopant concentration to lie in a range of approximately $8*10^{14}/cm^3$ to approximately $3*10^{16}/cm^3$.

As is evident from the comparison of FIGS. 1B and 1C, the first thermal step also leads to the further out diffusion of the p-well 30. During the first thermal step, an auxiliary oxide layer 20 can furthermore form on the uncovered surfaces of the semiconductor body 2. Said auxiliary oxide layer 20 covers the first surface 4 and also the uncovered surface regions of the trenches 10. The auxiliary oxide layer 20 can serve as a screen oxide during the subsequent implantation of a second dopant 18.

Figure 1D:
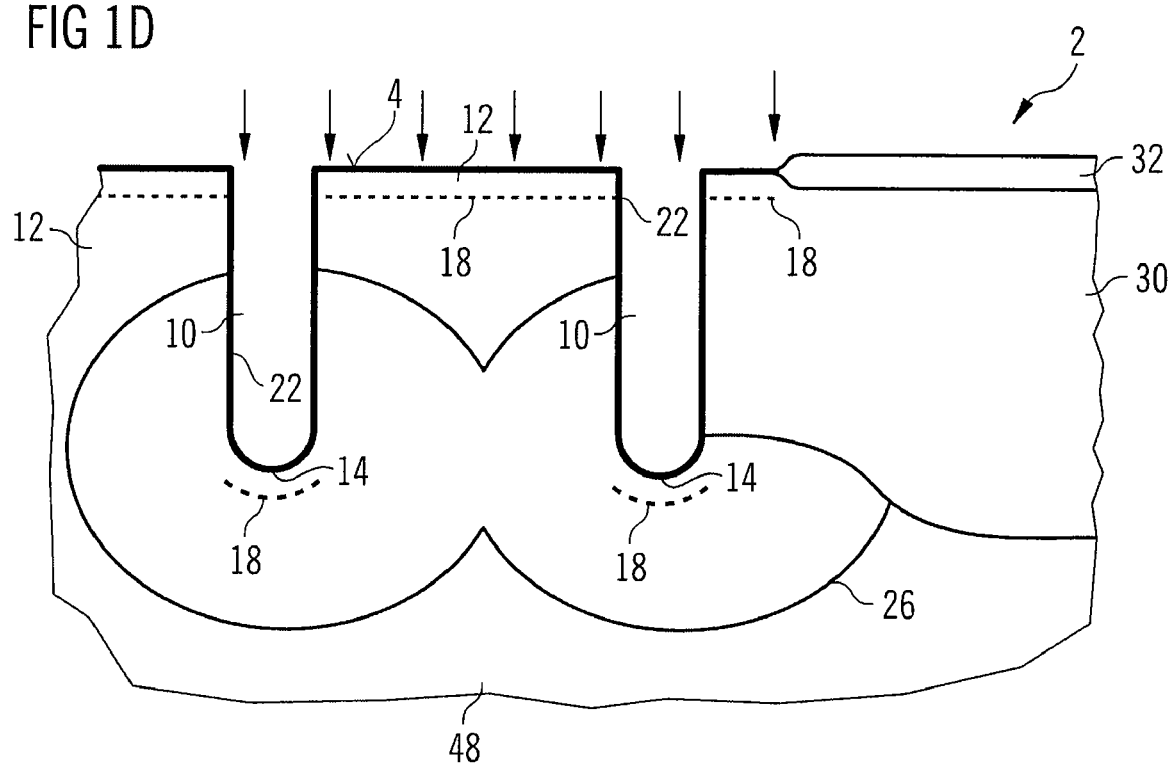

The implantation of the second dopant 18 (FIG. 1D), which is of the second conduction type complementary to the first conduction type, is illustrated in FIG. 1D. The second dopant can be boron, for example. The dose of the second dopant 18 can lie in a range of approximately $3*10^{12}/cm^2$ to approximately $1*10^{14}/cm^2$. It is likewise possible to work with a dose of approximately $4*10^{13}/cm^2$ to approximately $1*10^{14}/cm^2$. Furthermore, the dose can lie in a range of approximately $6*10^{13}/cm^2$ to $9*10^{13}/cm^2$, for example can be approximately $8*10^{13}/cm^2$. In this case, the implantation is effected both into the trench bottoms 14 and into the uncovered regions of the first surface 4, that is to say in particular into the regions of the mesa structures 12 that are near the surface.

After the second dopant 18 has been implanted, the auxiliary oxide layer 20 is removed wet-chemically, for example. A gate oxide layer 22 can then be formed in particular thermally, wherein the gate oxide layer lines the trenches 10 in particular, and can also cover the uncovered regions of the semiconductor material of the semiconductor body 2 at the first surface 4 thereof.

The trenches 10 are subsequently filled with a conductive material, for example polysilicon. This can be done for example by deposition of a polysilicon layer with subsequent doping and patterning thereof. The polysilicon layer is typically highly doped, such that the polysilicon in the trenches 10 can have a dopant concentration of approximately $1*10^{20}/cm^3$. The conductive material filled into the trenches 10 forms there the gate electrode 24 for the individual cells of the semiconductor component. The gate electrodes 24 arranged in the trenches 10 are accordingly insulated from the semiconductor body 2 by a gate dielectric 22.

Afterward, a second thermal step is effected for the at least partial or largely complete out diffusion of the implanted second dopant 18. The second thermal step can be carried out at a temperature in the range of approximately 1000° C. to approximately 1200° C., and in particular at approximately 1150° C., for approximately 60 minutes. The first thermal step is typically effected at substantially the same temperature as the second thermal step, but for a longer time. As already described further above, the second thermal step can likewise lead to a further out diffusion of the first dopant 16. By means of the second thermal step, the second dopant 18 implanted into the trench bottoms 14 is at least partly outdiffused with formation of buried protective regions 28 that are typically completely embedded into the buffer region 26. In this case, the protective regions 28 largely completely surround the trench bottoms 14 and are formed approximately symmetrically with respect to the trench bottoms 14 in a vertical direction. The protective regions 28 are typically completely surrounded by the buffer region 26. The protective regions 28 can have a dopant concentration of approximately $2*10^{15}/cm^3$ to approximately $1*10^{17}/cm^3$, and in some variants of approximately $3*10^{16}/cm^3$ to approximately $1*10^{17}/cm^3$. The second thermal step is the essential thermal step with regard to the out diffusion of the second dopant 18.

Figure 1E:
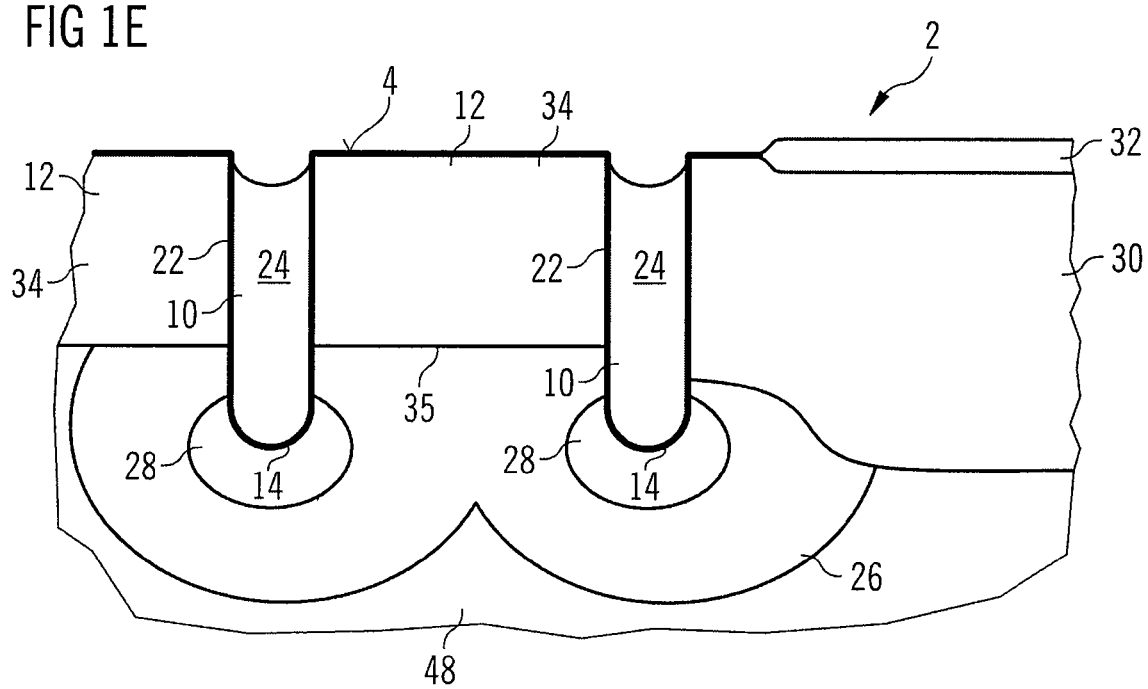

The second dopant 18 implanted into the regions of the mesa structures 12 that are near the surface is furthermore outdiffused into the semiconductor body 2 by means of the second thermal step. Body regions 34 are formed between the trenches 10 as a result. The body regions 34 can have a maximum dopant concentration of approximately $5*10^{16}/cm^3$ to approximately $5*10^{17}/cm^3$. As shown in FIG. 1E, the body regions 34 directly adjoin the buffer region 26 and lead to the formation of a pn junction 35 there. In principle the body regions 34 can respectively form a pn junction with the buffer region 26 and/or the semiconductor region or drift region 48. The vertical position of the substantially laterally extending pn junction 35 depends on the depth of the trenches 10, the implantation dose used for the first and second dopants, and also the temperature and length of the first and second thermal steps. The diffusion constant of the individual dopants likewise plays a part.

As is evident from FIGS. 1C and 1E, the buffer region 26 and the body regions 34 diffuse toward one another since the out diffusion of the body regions 34 takes place from the regions of the mesa structures 12 that are near the surface and the out diffusion of the buffer region 26 takes place from the region of the trench bottoms 14. The out diffusion of the buffer region 26 from the depth of the semiconductor body 2, that is to say from the region of the trench bottoms 14, improves the properties of the semiconductor component.

Firstly, the out diffusion of the buffer region begins precisely in those regions in the semiconductor body 2 in which the buffer region 26 is intended to be formed. This represents an improvement in particular in comparison with those production methods in which an out diffusion takes place from the surface of the semiconductor body. This is because in such production methods, the introduced dopant for forming a buffer region has to be outdiffused for a very long time or at very high temperatures in order that the buffer region 26 also encloses the bottoms of the trenches 10. Therefore, the method of the present embodiment can significantly reduce the diffusion time or diffusion temperature and hence the required thermal budget. Moreover, the formation of the buffer region 26 takes place practically automatically around the trench bottoms 14.

Secondly, since the first dopant is implanted only into the trench bottoms 14 and not into regions of the mesa structures 12 that are near the surface, the first dopant 16 also does not act as background doping for the second dopant 18 in the mesa structures 12. As a result, the implantation dose for the second dopant 18 can be comparatively low, whereby the properties of the body regions 34 can be established in a targeted manner more easily in particular with regard to a low channel doping and increased channel mobility of the charge carriers. The intended implantation of the first dopant 16 only into the trench bottoms 14 likewise has a favorable effect on the threshold voltage of the semiconductor components. Since the first dopant 16 is not implanted into the mesa structures 12, nor can it influence the threshold voltage of the semiconductor components there. Local fluctuations of the implanted dose are often observed during implantation methods, which fluctuations can lead to fluctuations of the dopant concentration and therefore also of the threshold voltage. By avoiding the implantation of the first dopant 16 into the mesa structures 12, therefore, it is possible to significantly reduce the fluctuations of the threshold voltage between adjacent cells.

Another factor contributing to the improvement is that no additional implantation masks are used, rather only the mask 6 used for the etching of the trenches 10 is subsequently also used as an implantation mask. As a result, the production method is cost-effective overall.

Consequently, the production method requires no additional masks, leads neither to an increase in the thermal budget nor to an increase in the process steps required, and at the same time prevents a high concentration of the second dopant 18 in the channel region that can lead to undesirable variations of the threshold voltage of the individual cells of the semiconductor component.

It is favorable to set a ratio of the implantation dose of first dopant to second dopant 18 of approximately 1:3 to approximately 1:10. What is thereby achieved is that the ratio of the dopant concentration of buffer region 26 to protective regions 28 in the region of the trench bottoms 14 lies approximately between 1:4 and approximately 1:12. These ranges have proved to be favorable for the performance of semiconductor components and in particular for avoiding electrical breakdowns in the region of the trench bottoms 14.

Figure 11:
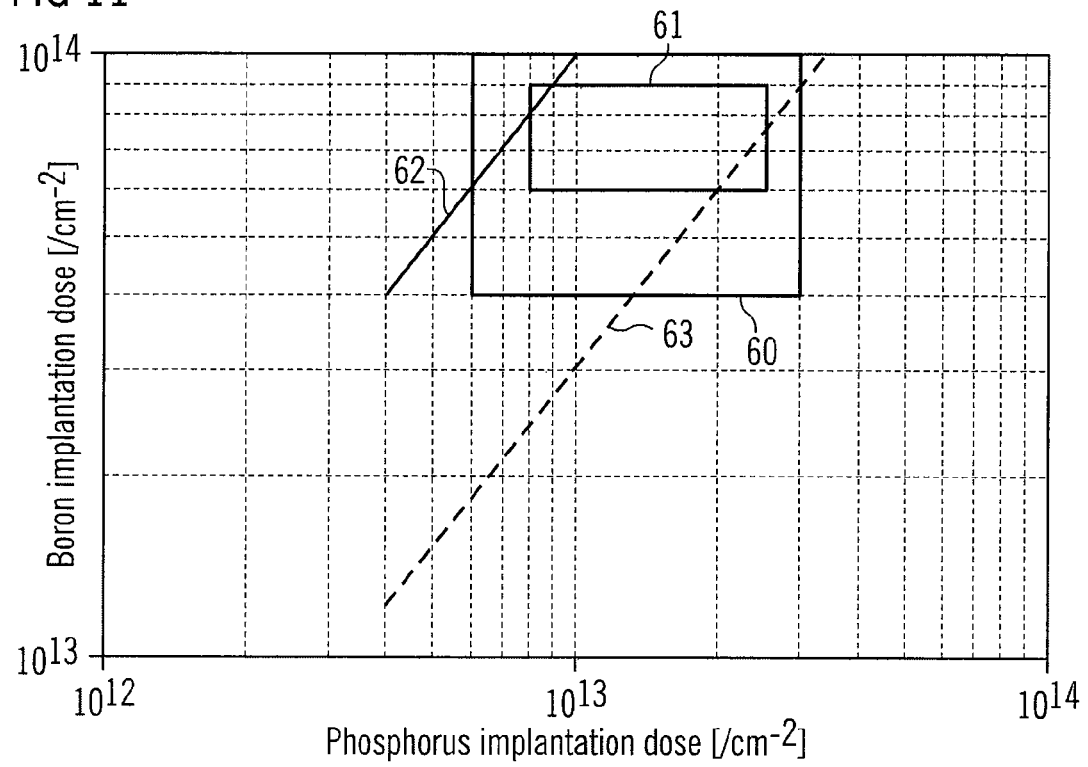
FIG. 11 shows the implantation conditions for the first embodiment.

To afford a better understanding of the suitable implantation doses for the first embodiment, reference is made to FIG. 11, which shows a graphical representation of suitable implantation doses. 60 indicates the maximum range for the phosphorus implantation dose (approximately $6*10^{12}/cm^2$ to approximately $3*10^{13}/cm^2$) and the boron implantation dose (approximately $4*10^{13}/cm^2$ to approximately $1*10^{14}/cm^2$)

for one example, while 61 indicates the range for a second example (phosphorus: approximately $8*10^{12}/cm^2$ to approximately $2.5*10^{13}/cm^2$; boron: approximately $6*10^{13}/cm^2$ to approximately $9*10^{13}/cm^2$). In this case, it is also possible additionally to take account of the secondary condition with regard to the ratio of the implantation doses of phosphorus to boron, wherein 62 shows one limit of the ratio of 1:10 and 63 shows the other limit of the ratio of 1:3. By way of example, the implantation doses can be chosen such that they lie within the range 60 and in addition within the range between the straight lines 62 and 63. On the other hand, the implantation doses can also lie within the range 61 and the straight lines 62 and 63. It has been shown in some examples that the boron implantation dose (second dopant) should be chosen to be as high as possible in relation to the phosphorus implantation dose (for example $8*10^{13}/cm^2$), in order to be able to set the threshold voltage Vgeth in a suitable manner.

Finally, a semiconductor region 50 of the second conduction type, for example an emitter region 50, can be formed at a second surface 56—opposite the first surface 4—of the semiconductor body 2 by means of, for example, suitable implantation or coating and outdiffusion. A field stop layer (not shown here) which is a highly doped n-conducting layer, can also be formed between the semiconductor region or emitter region 50 and the drift region 48. A rear side electrode 52 with an electrode connection 54 can then be formed on the second surface 56.

Figure 1F:
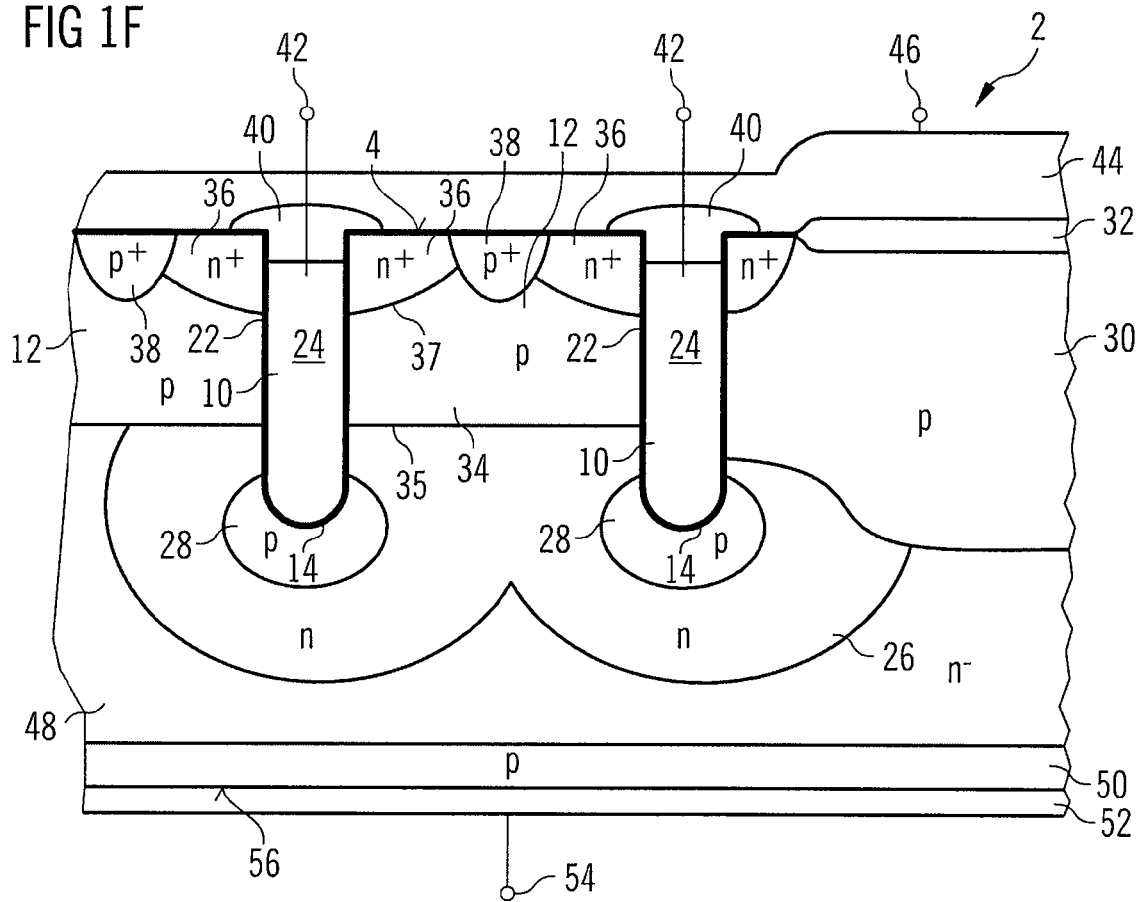

Source regions 36 of the first conduction type and body contact regions 38 of the second conduction type can be formed in regions of the mesa structures 12 that are near the surface. The source regions 36 are typically produced in the body regions 34. The source regions 36 can be produced in such a way that they are arranged in the mesa structures 12 at the first surface 4 and adjoin the trenches 10. The source regions 36 are highly doped n-conducting regions and can have a maximum dopant concentration of approximately $1*10^{20}/cm^3$ to approximately $1*10^{21}/cm^3$. The source regions 36 form a pn junction 37 with the body regions 34 and adjoin the trenches 10. The body contact regions 38 are highly doped p-conducting regions and can have a dopant concentration of approximately $1*10^{18}/cm^3$ to approximately $1*10^{20}/cm^3$. The trenches 10 are closed off with an insulation region 40, such that they are insulated from the front side electrode 44 that is subsequently to be applied. Contact is made with the gate electrodes 24 arranged in the trenches 10 by means of suitable gate connections 42. The front side electrode 44 is connected to an electrode connection 46. The structure thus obtained is illustrated in FIG. 1F. Here this is an IGBT. As an alternative it is possible to produce a power field effect transistor. In this case, instead of the emitter region 50 shown in FIG. 1F, an n-doped drain region having a higher dopant concentration than the drift region 48 is produced at the second surface 56 of the semiconductor body 2. So-called vertical components are involved in both cases since the current flow essentially runs from the first surface 4 to the second surface 56.

The individual trenches 10 define separate cells of a semiconductor component which together form a power semiconductor component. The effective cross section for the current flow can be correspondingly increased by forming correspondingly many cells such that power semiconductor components having high rated currents typically have many cells. In this case, the cell shown in the right-hand region in FIG. 1F forms an edge cell. Toward the left, the structure continues symmetrically and is then once again terminated by an edge cell.

The trenches 10 are typically formed at a distance from the drift region 48 and above the latter. In the present embodiment, the buffer region 26 completely surrounds the lower region of the trenches 10, such that the trenches 10 are arranged above the drift region 48. The buffer region 26 likewise adjoins the body regions 34. If the buffer region 26 is not formed as a continuous layer, the drift region 48 can also reach between the trenches 10 as far as the body regions 34. However, the lower region of the trenches 10 including the trench bottoms 14 typically remains completely surrounded by the buffer region 26 and the protective regions 28. It is likewise possible for the buffer region 26 to be formed as a continuous layer without being in direct contact with the body regions 34. In this case, the buffer region 26 is formed as a buried layer in the drift region 48 and the pn junction forms between a region of the drift region 48 that remains above the buffer region 26 and the body regions 34. The body regions 34 are typically arranged above the trench bottoms 14 and at a distance from the latter.

Figure 5A:
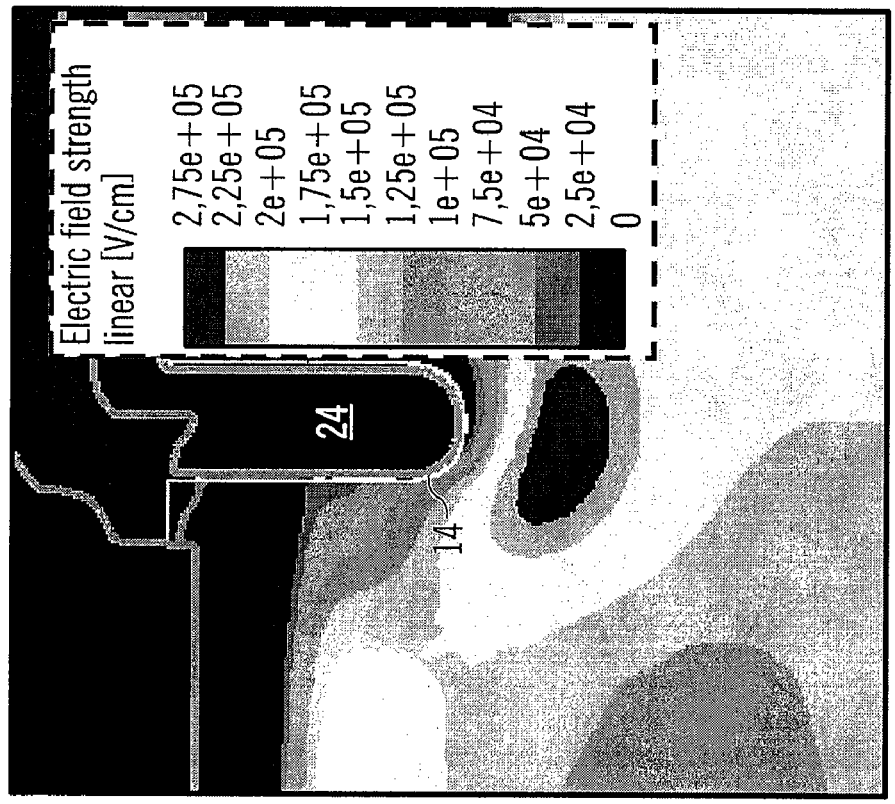
FIGS. 5A and 5B show simulation results for illustrating the electric field strength distribution upon breakdown for a conventional semiconductor component (FIG. 5A) and for a semiconductor component produced according to the first embodiment (FIG. 5B).
Figure 5B:
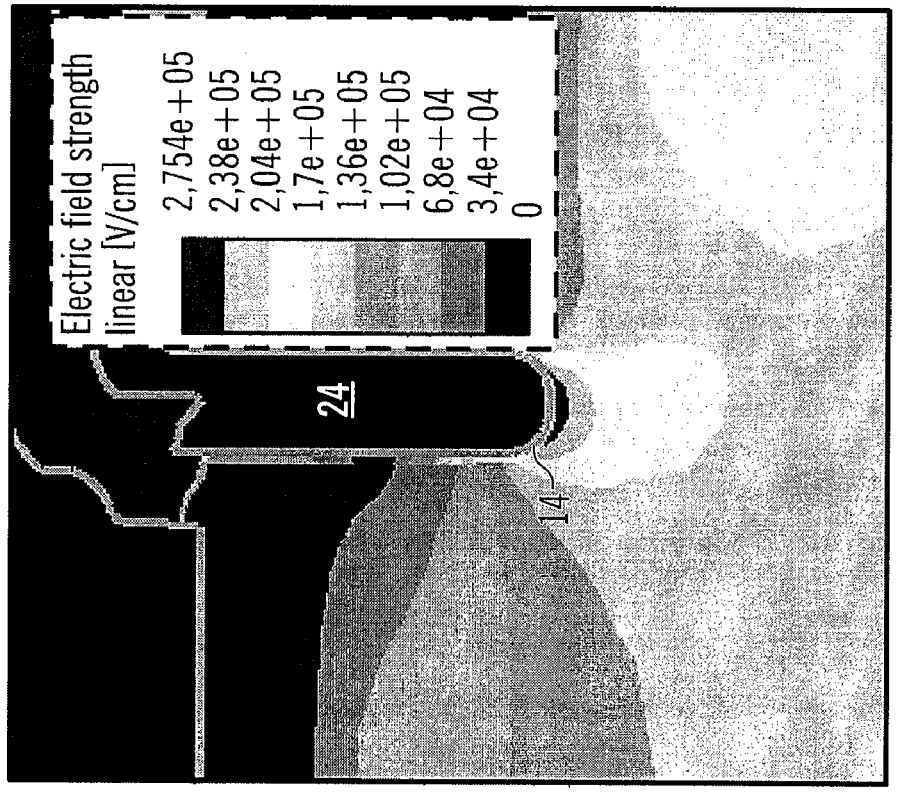

The method of operation of the buffer region 26 and of the protective regions 28 will be explained, without wishing to be restrictive, on the basis of the structure of an IGBT as shown in FIG. 1F. In the off-state case, the reverse voltage is reduced in the buffer region 26 or the drift region 48. If the electrical conditions are imagined on the basis of the potential lines, then high field strengths occur in those regions in which the potential lines are closely packed. In this case, the position of the potential lines is determined by the dopant distribution and geometrical boundary conditions. Inhomogeneities typically lead to a compaction of the potential lines and thus to a local increase in the field strength. Therefore, high field strengths are also observed in the region of the trench bottoms 14. The p-doped protective regions 28 now alter the electrical conditions in such a way that the electrical potential lines are at least partly forced out from the direct vicinity around the trench bottoms 14. As a result, the formation of high field strengths is avoided there. This is illustrated for example in FIGS. 5A and 5B. In this case, FIG. 5A shows the structure of a conventional semiconductor component which does not contain a protective region of the second conduction type in the region of the trench bottoms 14. As can be discerned, the electric field strength is comparatively high there directly below the trench bottom. In contrast thereto, as shown in FIG. 5B, the maximum of the electric field strength is shifted further into the depth of the semiconductor body 2 and from the region of the trench bottoms 14. This is achieved by means of the protective regions 28.

Figure 6A:
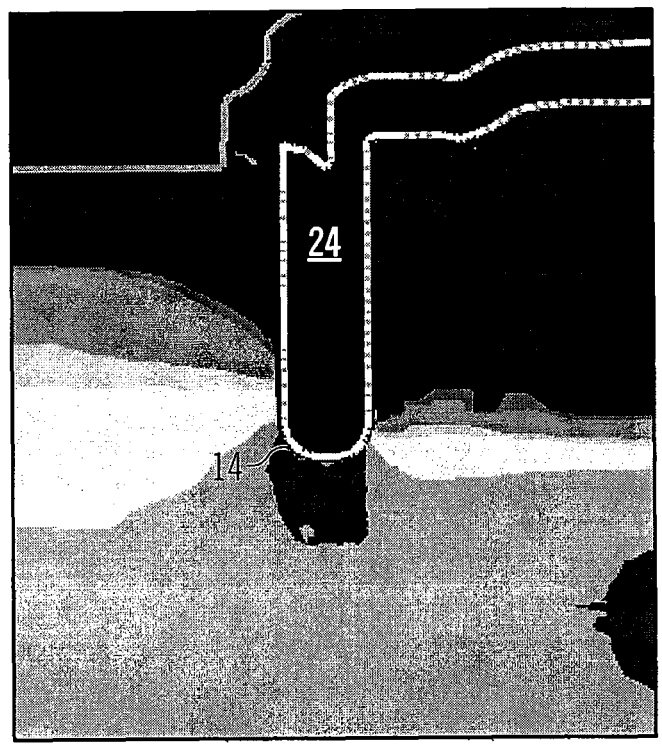
FIGS. 6A and 6B show simulation results for illustrating the impact ionization rate for a conventional semiconductor component (FIG. 6A) and for a semiconductor component produced according to the first embodiment (FIG. 6B).
Figure 6B:
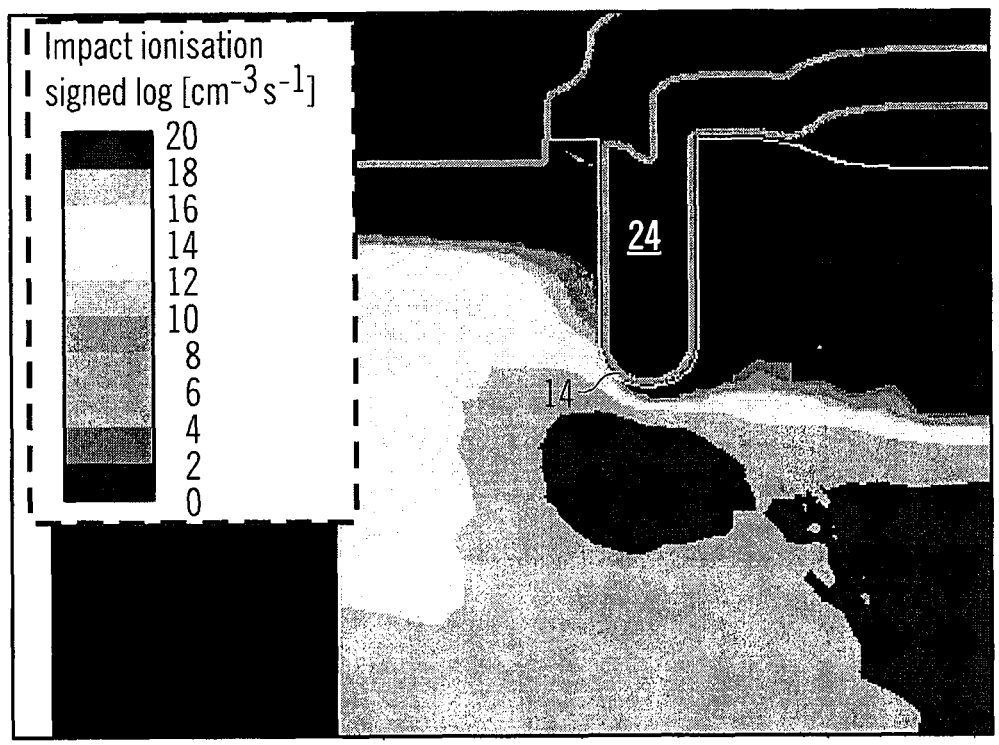

This is also associated with a shift in the location of the highest impact ionization rate during breakdown, as can be discerned from the comparison of FIGS. 6A and 6B. On account of the protective regions 28, the maximum of the impact ionization rate is locally displaced from the trenches 10, and in particular the trench bottoms, whereby the probability that hot charge carriers can be injected into the gate oxide 22 is significantly reduced. The injection of hot charge carriers into the gate oxide 22 is responsible for a shift in the switching parameters during reliability tests in which currents that are 2 to 7 times as high as the rated current of the semiconductor component are multiply switched. Hot charge carriers possibly injected in this case would lead in the long term to the failure of the semiconductor component. Therefore, the protective regions 28 improve the long-term reliability of the semiconductor components.

As has been found in experiments, the shift in the breakdown location away from the gate oxide also leads to improved dynamic switching properties of the semiconductor component, which is thus better able to adapt itself dynamically to voltage spikes that can occur for example as a result of self-induction when high load currents are switched off.

Furthermore, the more highly doped buffer region 26 in comparison with the drift region 48 leads to an improvement in the component properties in the on-state case, since the more highly doped buffer region 26 leads to a reduction of the on resistance Ron.

Figure 2:
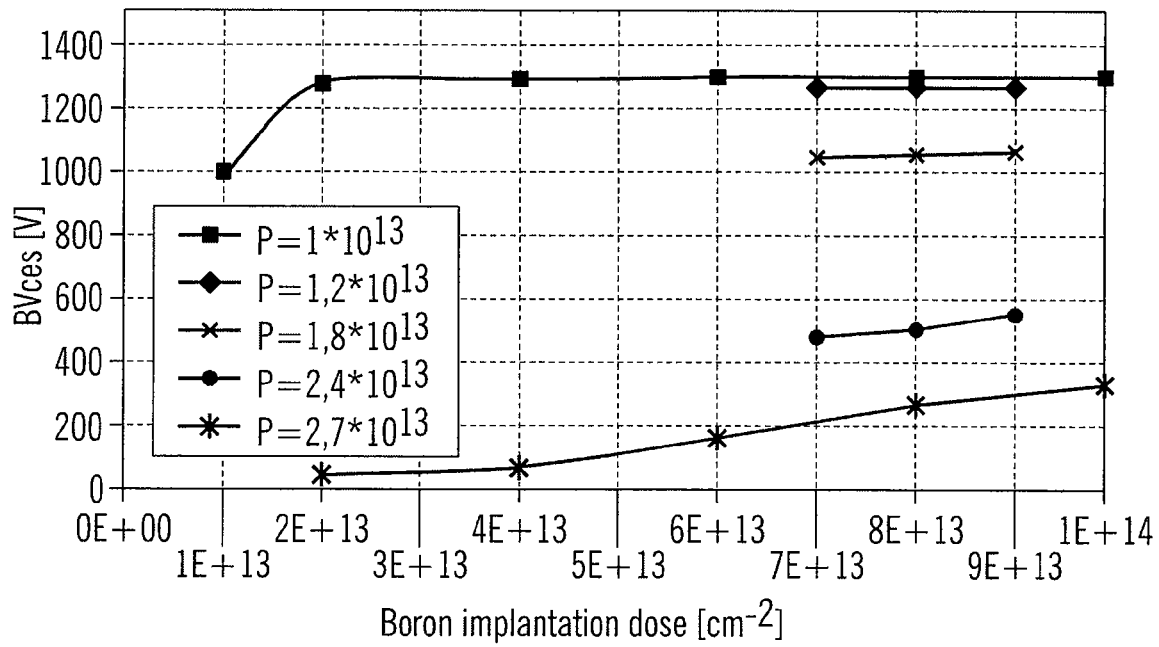
FIG. 2 shows simulation results for evaluating the breakdown voltage BVces as a function of the implantation dose used.
Figure 3:
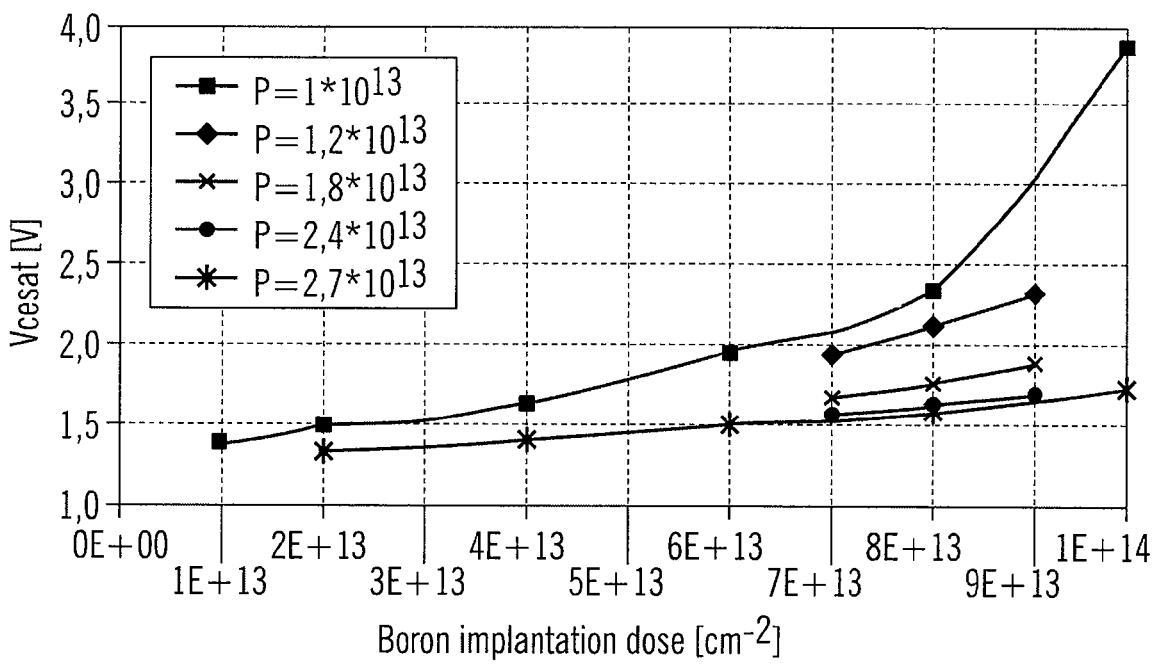
FIG. 3 shows simulation results for assessing the voltage Vcesat present across a semiconductor component in the on state as a function of the implantation dose used.
Figure 4:
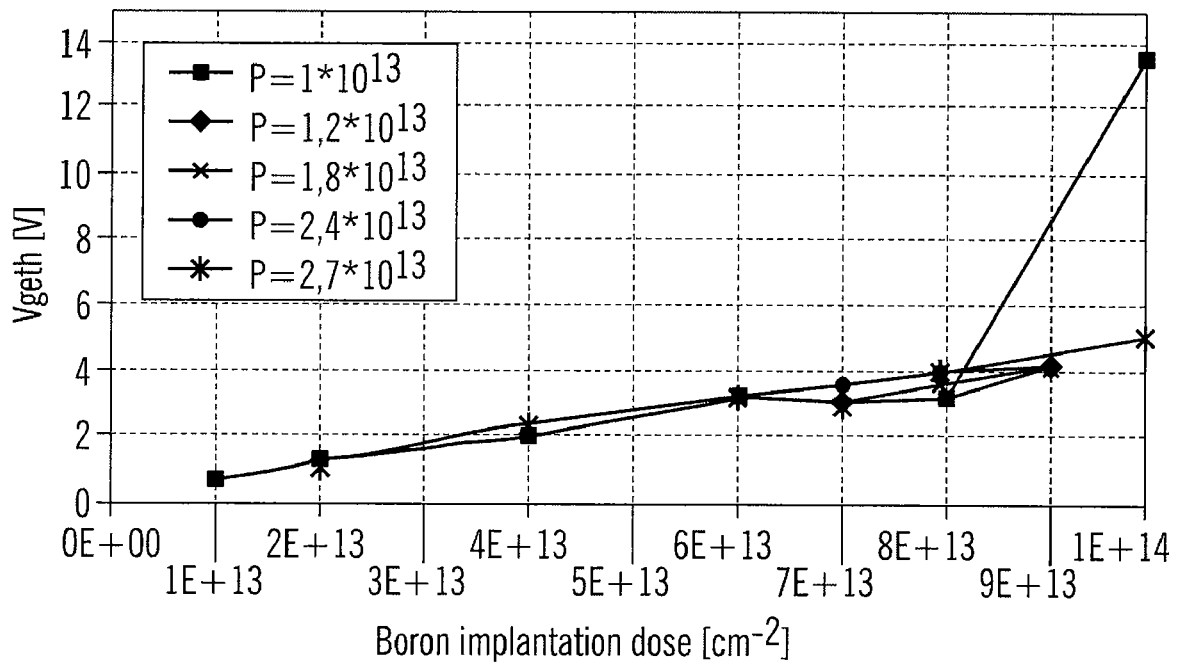
FIG. 4 shows simulation results for evaluating the threshold voltage Vgeth as a function of the implantation dose used.

FIGS. 2 to 4 reveal the influence of the boron implantation dose, that is to say the implantation dose of the second dopant 18, on the breakdown voltage BVces (FIG. 2), the voltage Vcesat in the switched-on state (FIG. 3), and the threshold voltage Vgeth (FIG. 4). BVces denotes the voltage between front electrode 44, which in terms of circuitry is also referred to as emitter, and the rear side electrode 52, which in terms of circuitry is also referred to as collector. Vcesat is likewise determined between front electrode 44 and rear side electrode 50. Vgeth is the voltage which has to be applied to the gate electrode 24 in order that a conductive channel is established in the body region 34.

The corresponding dependencies were plotted for various phosphorus implantation doses, i.e. dose of the first dopant 16. The respective phosphorus implantation doses in $cm^{-2}$ are indicated in the corresponding legend for each curve. It can be discerned that the boron implantation dose, i.e. the second implantation, should be higher than the phosphorus implantation dose. Favorable process parameters for the embodiment shown in FIGS. 1A to 1F are for example a phosphorus implantation dose of $1*10^{13}/cm^2$ and a boron implantation dose of approximately $8*10^{13}/cm^2$. This results in a ratio of the implantation doses of approximately 1:8. The implantation doses chosen lead to a dopant concentration of the buffer region 26 of approximately $8*10^{15}/cm^3$ and of the protective regions 28 of approximately $8*10^{16}/cm^3$. This corresponds to a ratio of the dopant concentrations of approximately 1:10. The slightly increased ratio of the dopant concentrations in comparison with the implantation doses is caused by the fact that the buffer region 26 outdiffuses spatially further than the protective regions 28. The formation of buffer region 26 or buffer regions 26 and protective regions 28 also leads to the improvement of the coordination between Vcesat-Eoff (Vcesat-Eoff trade-off).

Figure 7A:
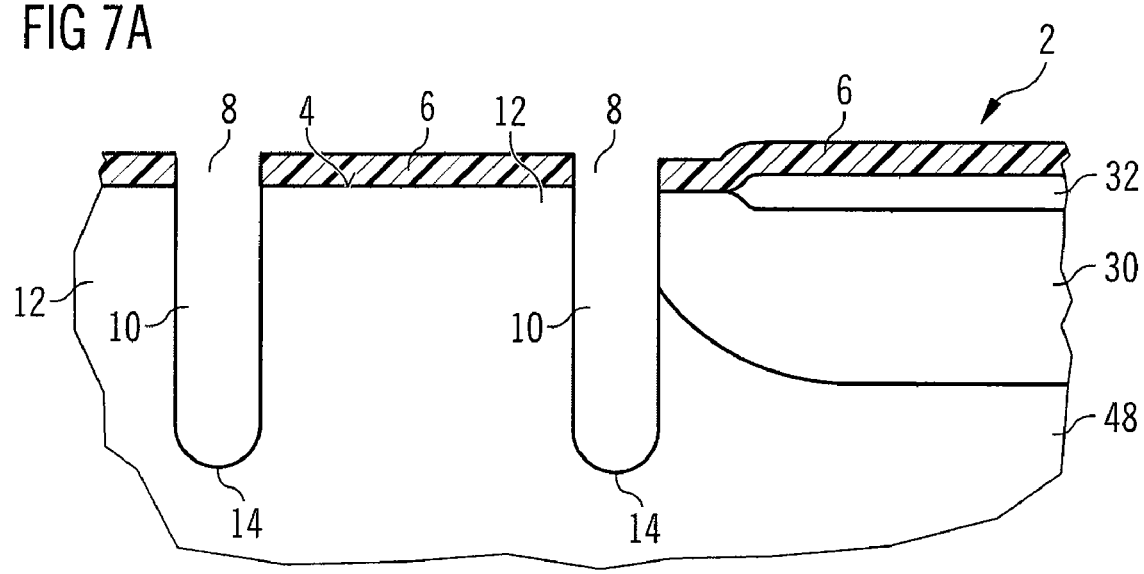
FIGS. 7A to 7F show individual steps of a production method in accordance with a second embodiment.
Figure 7B:
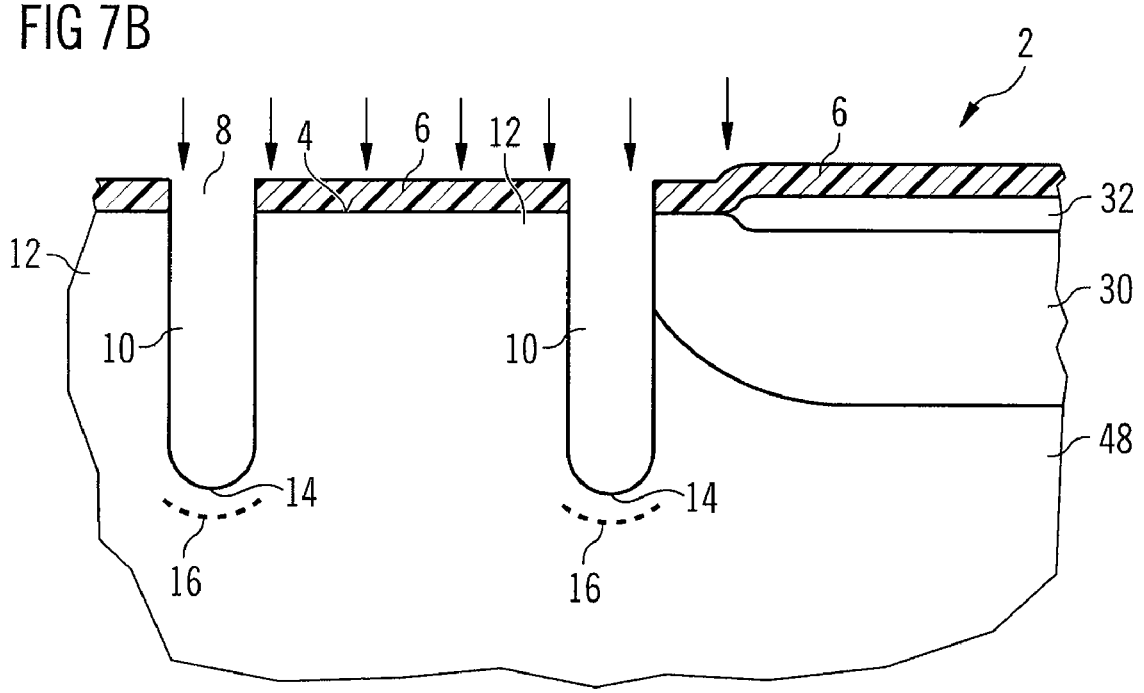

A second embodiment of the production method is described with reference to FIGS. 7A to 7F. The first steps of this embodiment, which are shown in FIGS. 7A and 7B, correspond to the steps shown in FIGS. 1A and 1B. A repetition of the description is therefore dispensed with.

Figure 7C:
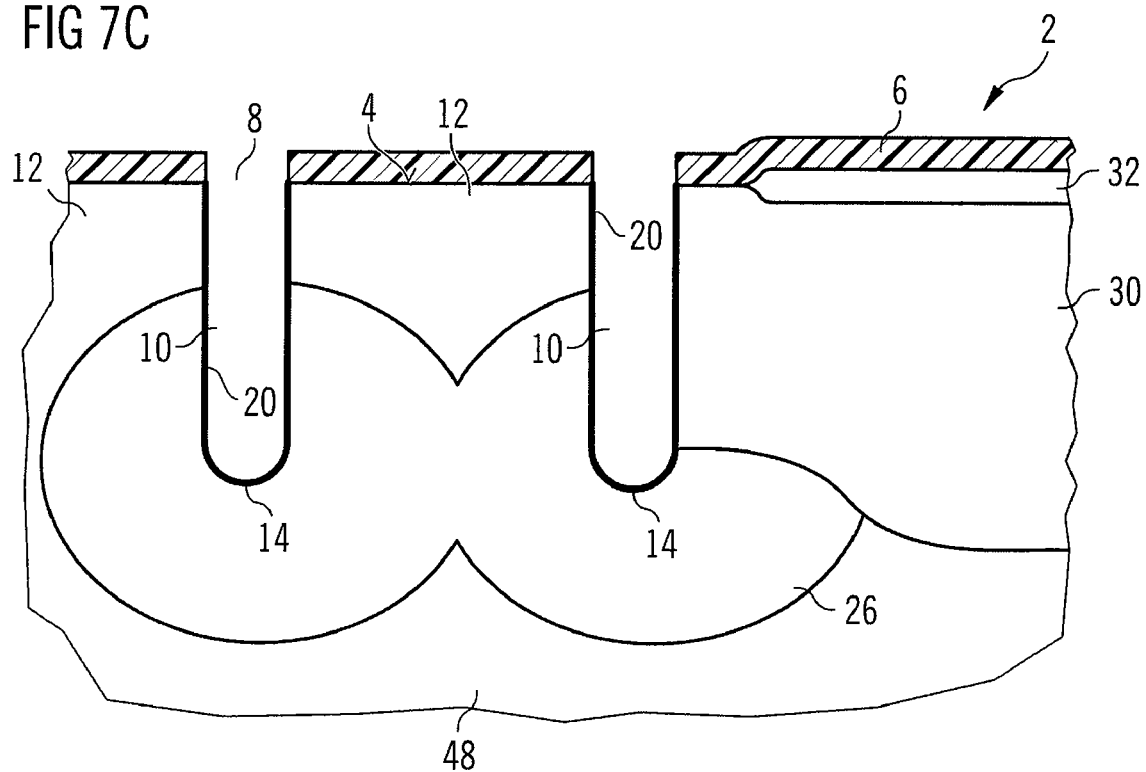
Figure 7D:
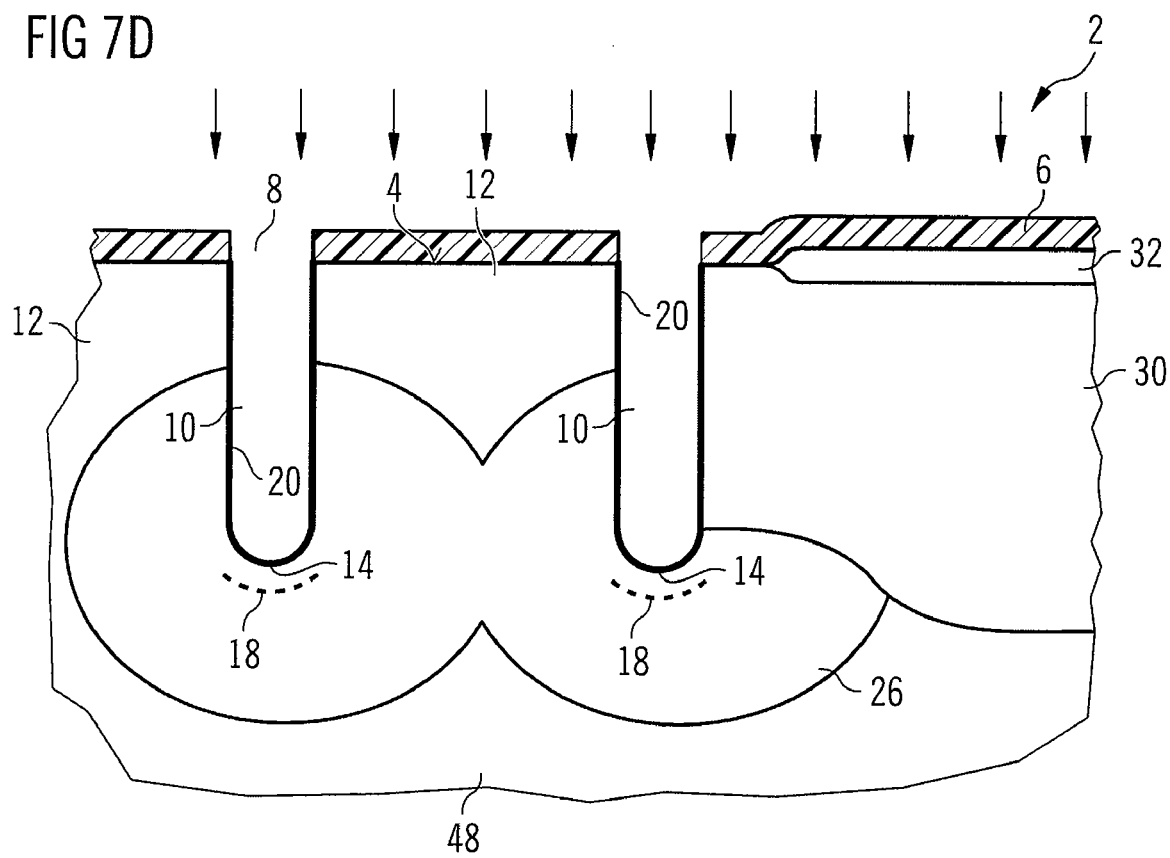

In contrast to the first embodiment, after the implantation of the first dopant 16 has taken place, the mask 6 is not removed. Therefore, the mask 6 also remains on the first surface of the semiconductor body 2 during the first thermal step. As a result, during the outdiffusion of the first dopant 16, auxiliary oxide layers 20 arise only on the uncovered surface regions of the trenches 10. The first thermal treatment of the second embodiment can be carried out, in principle, with the same process parameters as in the first embodiment. The first dopant can also be implanted with a dose of approximately $2*10^{12}/cm^2$ to approximately $2*10^{13}/cm^2$. The structure thus obtained is shown in FIG. 7C.

The second dopant 18 is subsequently implanted using the mask 6. On account of the mask 6, the implantation is effected only into the trench bottoms 14. In principle, it is possible to work with the same dose as in the first embodiment. In comparison with the first embodiment, the implantation dose of the second dopant 18, which is boron here, can also be changed and in particular reduced. By way of example, it is possible to work in a range of approximately $1.2*10^{13}/cm^2$ to approximately $6*10^{13}/cm^2$. It is likewise possible to set the dose to values of between approximately $2*10^{13}/cm^2$ and approximately $5*10^{13}/cm^2$. As a result, the ratio of the implantation dose of first dopant 16 to second dopant 18 lies for example approximately between 1:3 and approximately 1:5.

Figure 12:
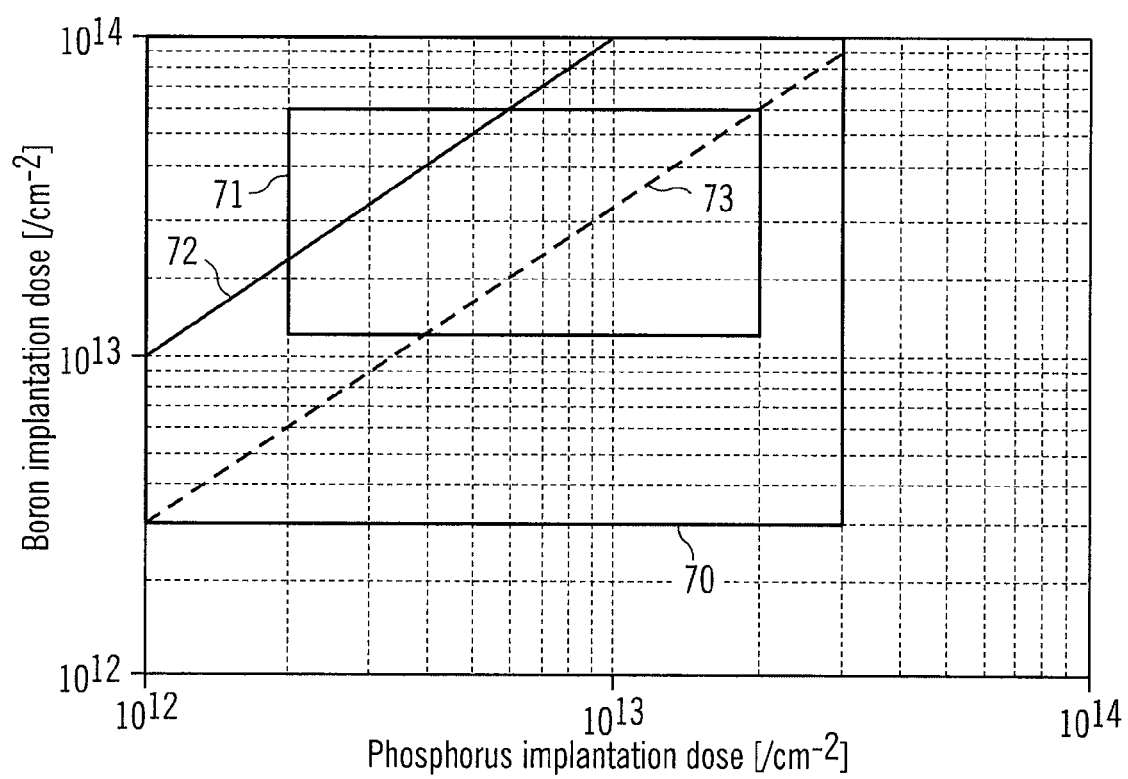
FIG. 12 shows the implantation conditions for the second embodiment.

Typical implantation doses for the second embodiment can be gathered from FIG. 12, wherein 70 shows a range for the phosphorus implantation dose of approximately $1*10^{12}/cm^2$ to approximately $3*10^{13}/cm^2$ and the boron implantation dose of approximately $3*10^{12}/cm^2$ to approximately $1*10^{14}/cm^2$ for a first example. 71 indicates a range for a second example (phosphorus: from approximately $2*10^{12}/cm^2$ to approximately $2*10^{13}/cm^2$; boron: approximately from $1.2*10^{13}/cm^2$ to approximately $6*10^{13}/cm^2$). Secondary conditions with regard to the ratio of the implantation doses of phosphorus to boron can additionally be taken into account, wherein 72 indicates a ratio of 1:10 and 73 a ratio of 1:3. The implantation doses can be chosen such that they lie within the regions 70 and 71 and additionally within the straight lines 72 and 73. The implantation doses can be reduced in comparison with the first embodiment.

By means of a subsequent second thermal treatment, the second dopant 18 is outdiffused and in the process forms protective regions 28 in the region of the trench bottoms 14. The auxiliary oxide layers 20 and also the mask 6 are then removed in a suitable manner, for example wet-chemically.

The implantation dose of the second dopant 18 can be scaled in a suitable manner depending on the implantation dose of the first dopant. By way of example, it is possible to implant the second dopant 18 with an implantation dose that is approximately 4 times as high as that of the first dopant 16. This ensures that the second dopant 18 is always present in a sufficiently high concentration. However, it is also possible to reduce the implantation dose of the second dopant to values of approximately $1.5*10^{13}/cm^2$ to approximately $2*10^{13}/cm^2$. In this case, however, the implantation dose of the first dopant should be chosen to be correspondingly low in order to avoid a fall in the breakdown voltage BVces, as can be seen for example from FIG. 8.

Figure 7E:
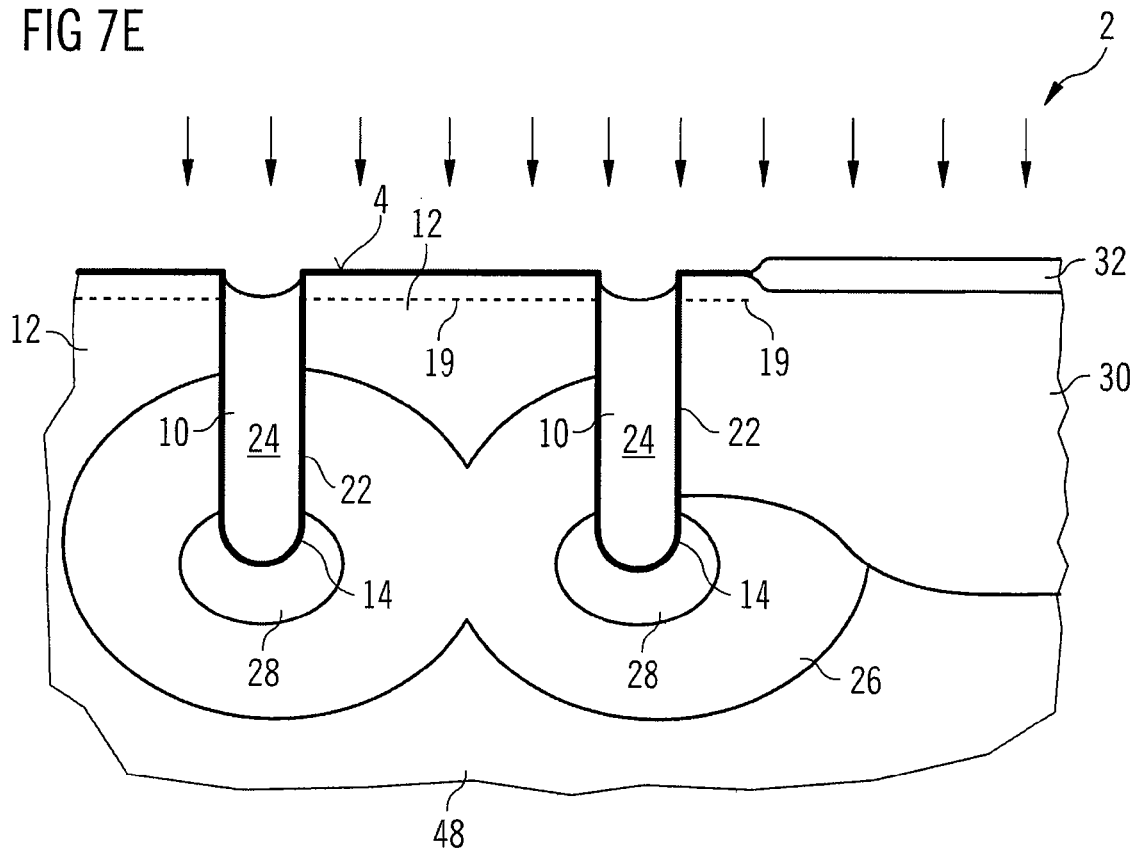

Afterward, in a manner comparable with the steps described in connection with FIG. 1E of the first embodiment, the gate electrodes 24 are formed in the trenches 10, that is to say that the trenches 10 are largely filled with a conductive material 24. A third dopant 19 is then introduced, for example implanted, into regions of the mesa structures 12 that are near the surface. The third dopant 19 can be boron, for example, which is implanted with an implantation dose of approximately $8*10^{12}/cm^2$ to approximately $5*10^{13}/cm^2$. As a result of the trenches 10 being filled with the conductive material, the trench bottoms 14 are protected, such that during the implantation of the third dopant 19, the latter is not implanted into the trench bottoms 14. The structure thus obtained is shown in FIG. 7E.

Figure 7F:
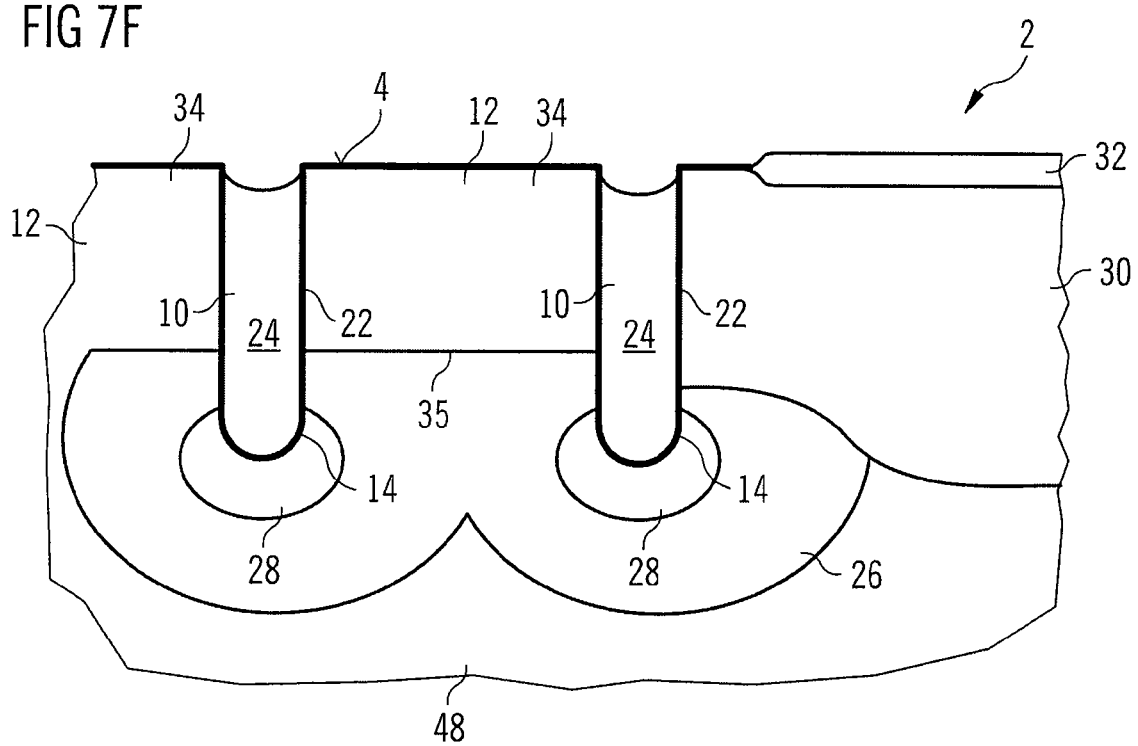

The outdiffusion of the third dopant 19 is effected by means of a subsequent third thermal step, whereby the body regions 34 are formed in the mesa structures 12. If appropriate, the second thermal step can also be combined with the third thermal step, such that body regions and protective regions are then outdiffused simultaneously. The structure thus obtained is shown in FIG. 7F. The third thermal step can be carried out at a temperature in the range of approximately 1100° C. to approximately 1200° C., and in particular at approximately 1150° C., for approximately 60 minutes.

In this embodiment, the implantation for the formation of the protective regions 28 and of the body regions 34 take place independently of one another and can thereby be better adapted to the desired requirements. Moreover, the separate thermal steps permit better control of the outdiffusion. By way of example, the implantation dose for the first dopant 16 can be in the region of approximately $1*10^{13}/cm^2$ and the implantation dose for the second dopant 18 can be approximately $4*10^{13}/cm^2$. This corresponds to a ratio of the implantation doses of approximately 1:4. These implantation doses lead to a dopant concentration of the buffer region 26 of approximately $8*10^{15}/cm^3$ and of the protective regions 28 of approximately $4*10^{16}/cm^3$. This corresponds to a ratio of approximately 1:5. The dopant concentration of the second dopant 18 can therefore be reduced in comparison with the first embodiment. However, this does not have a disadvantageous effect on the dopant concentration of the body regions 34 since a separate implantation is effected for producing said body regions. In principle, the dopant concentration for the buffer region 26 can lie between approximately $8*10^{14}/cm^3$ and approximately $3*10^{16}/cm^3$ and the dopant concentration for the protective regions 28 can lay between approximately $2*10^{15}/cm^3$ and approximately $1*10^{17}/cm^3$.

Finally, in a manner comparable with the steps described in connection with FIG. 1F of the first embodiment, an emitter region or a drain region, the rear side electrode and also the source regions, body contact regions and the front side electrode are formed.

As in the first embodiment, the method of the second embodiment requires no further masks. In this case, too, the outdiffusion takes place "from the depth" of the semiconductor body 2. The method of the second embodiment likewise permits the same or comparable structures having comparable properties with respect to the method in accordance with the first embodiment to be produced, for which reason a repetition is dispensed with.

Figure 8:
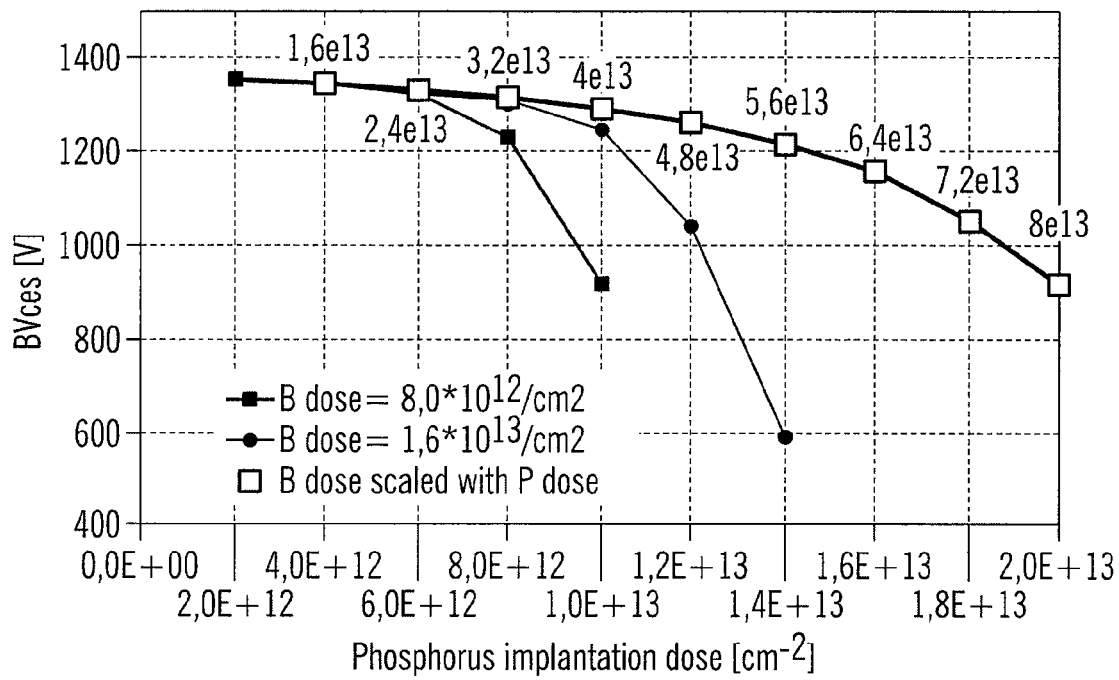
FIG. 8 shows simulation results for the evaluation of the breakdown voltage BVces as a function of the implantation dose used.
Figure 9:
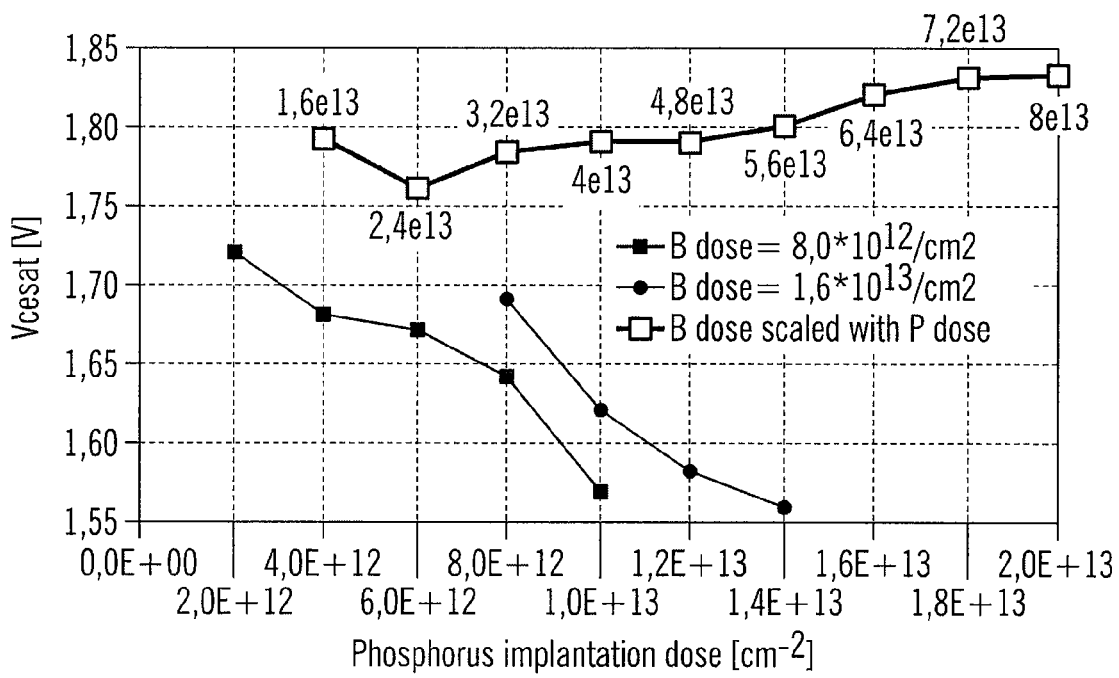
FIG. 9 shows simulation results for assessing the voltage Vcesat present across a semiconductor component in the on state as a function of the implantation dose used.
Figure 10:
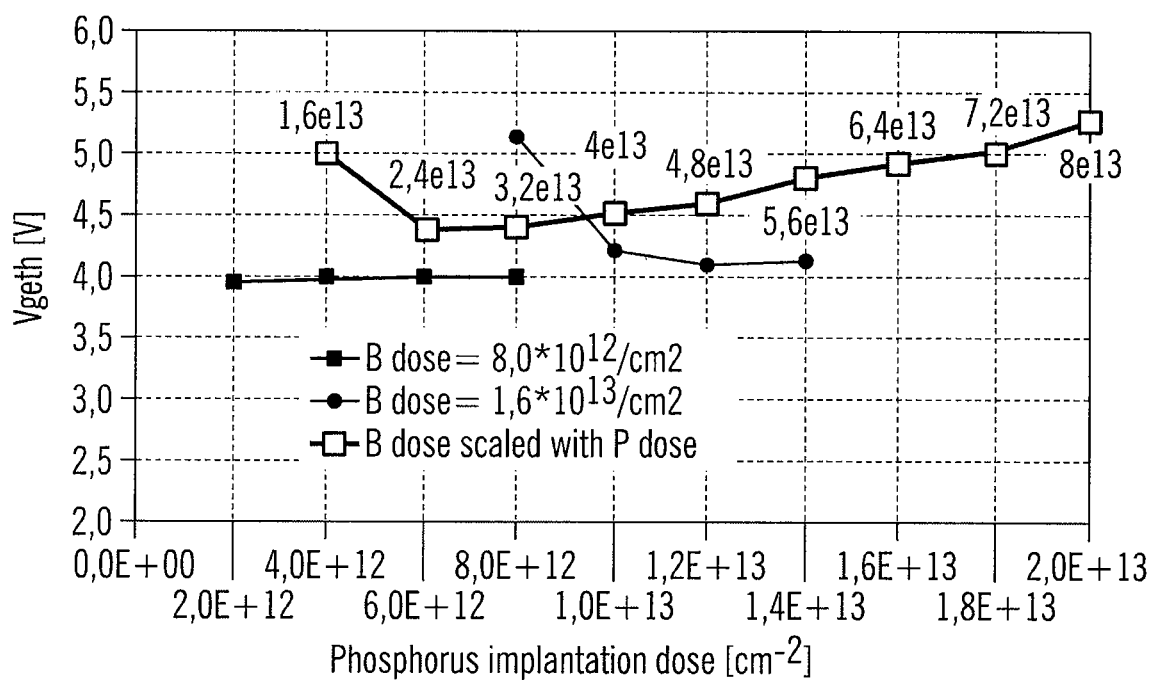
FIG. 10 shows simulation results for evaluating the threshold voltage Vgeth as a function of the implantation dose used.

FIGS. 8 to 10 show simulation results with regard to the breakdown voltage BVces (FIG. 8), the voltage Vcesat in the switched-on state (FIG. 9) and the threshold voltage Vgeth (FIG. 10) as a function of the phosphorus and boron implantation dose. The simulation results shown here are based on semiconductor components that were produced in accordance with the second embodiment. The boron implantation doses indicated relate to the implantation of the second dopant 18 into the trench bottoms 14. A trench depth of approximately 4 μm was taken as a basis for all the simulations. The respective boron implantation dose is indicated directly in the curves in which the boron implantation dose scales with the phosphorus implantation dose. In the other curves, the respective constant boron implantation dose is indicated in the legend. The implantation doses are indicated in $cm^{-2}$.

As can be discerned, for comparatively low phosphorus implantation doses of less than $1*10^{13}/cm^2$, the breakdown voltage BVces is very high. The fall in the breakdown voltage BVces above a phosphorus implantation dose of approximately $1*10^{13}/cm^2$ can be compensated for by increasing the boron implantation dose or by scaling the boron implantation dose with the phosphorus implantation dose, for example in the ratio of 1:4 of phosphorus implantation dose to boron implantation dose. In simulations and experiments that are not shown here, it has likewise been found that the breakdown voltage Bvces is lower in the case of identical implantation doses but with a trench depth of approximately 6 μm. Since the implantation doses can be varied in a comparatively large range in the second embodiment, Bvces, Vcesat and Vgeth can be set in a suitable manner even with variation of the trench depth.

The invention is not restricted to the embodiments described above, but rather encompasses suitable modifications within the scope manifested by the claims. The appended claims should be understood as a first, non-binding attempt to describe the invention using general words.

The invention claimed is:

1. A method for producing a semiconductor component, comprising:
   providing a semiconductor body comprising a first surface;
   forming a mask on the first surface, wherein the mask comprises openings for defining respective positions of trenches;
   producing the trenches in the semiconductor body using the mask, wherein mesa structures remain between adjacent trenches;
   introducing a first dopant of a first conduction type using the mask into the bottoms of the trenches;
   carrying out a first thermal step, wherein the first dopant is at least partly outdiffused in order to form at least one buried buffer region;
   introducing a second dopant of a second conduction type, which is complementary to the first conduction type, at least into the bottoms of the trenches; and
   carrying out a second thermal step,
   wherein the mask is removed before the second dopant is introduced, such that when the second dopant is introduced, the second dopant is also introduced into the mesa structures, and
   wherein, by means of the second thermal step, the second dopant introduced into the mesa structures is at least partly outdiffused in order to form body regions in the mesa structures.

2. The method as claimed in claim 1, wherein the first and the second dopant are in each case introduced by means of implantation into the semiconductor body.

3. The method as claimed in claim 2, wherein the ratio of the implantation dose of first dopant to second dopant lies between approximately 1:3 and approximately 1:10.

4. The method as claimed in claim 2, wherein the first dopant is implanted with a dose of approximately $1*10^{12}/cm^2$ to approximately $3*10^{13}/cm^2$.

5. The method as claimed in claim 2, wherein the second dopant is implanted with a dose of approximately $3*10^{12}/cm^2$ to approximately $1*10^{14}/cm^2$.

6. The method as claimed in claim 1, wherein, by means of the second thermal step, the second dopant is at least partly outdiffused in order to form protective regions.

7. The method as claimed in claim 1, wherein the first dopant is implanted with a dose of approximately $6*10^{12}/cm^2$ to approximately $3*10^{13}/cm^2$.

8. The method as claimed in claim 1, wherein the second dopant is implanted with a dose of approximately $4*10^{13}/cm^2$ to approximately $1*10^{14}/cm^2$.

9. The method as claimed in claim 1, wherein the second dopant is introduced using the mask.

10. The method as claimed in claim 9, wherein the first dopant is implanted with a dose of approximately $2*10^{12}/cm^2$ to approximately $2*10^{13}/cm^2$.

11. The method as claimed in claim 9, wherein the second dopant is implanted with a dose of approximately $1.2*10^{13}/cm^2$ to approximately $6*10^{13}/cm^2$.

12. The method as claimed in claim 1, wherein at least two adjacent buried buffer regions are merged.

13. A method for producing a semiconductor component, comprising:
   providing a semiconductor body comprising a first surface;
   forming a mask on the first surface, wherein the mask comprises openings for defining respective positions of trenches;

producing the trenches in the semiconductor body using the mask, wherein mesa structures remain between adjacent trenches;

introducing a first dopant of a first conduction type using the mask into the bottoms of the trenches;

carrying out a first thermal step;

introducing a second dopant of a second conduction type, which is complementary to the first conduction type, at least into the bottoms of the trenches using the mask;

carrying out a second thermal step;

removing the mask after introducing the second dopant;

introducing a third dopant of the second conduction type into the mesa structures; and carrying out a thermal step in which the third dopant is at least partly outdiffused in order to form body regions.

14. The method as claimed in claim 13, wherein the third dopant is implanted into the mesa structures.

15. The method as claimed in claim 14, wherein the third dopant is implanted with a dose of approximately $8*10^{12}/cm^2$ to approximately $5*10^{13}/cm^2$.

16. A method for producing a semiconductor component, comprising:

providing a semiconductor body comprising a first surface;

foaming a mask on the first surface, wherein the mask comprises openings for defining respective positions of trenches;

producing the trenches in the semiconductor body using the mask, wherein mesa structures remain between adjacent trenches;

introducing a first dopant of a first conduction type using the mask into the bottoms of the trenches;

carrying out a first thermal step;

introducing a second dopant of a second conduction type, which is complementary to the first conduction type, at least into the bottoms of the trenches; and carrying out a second thermal step, wherein the second dopant is at least partly outdiffused in order to form protective regions, wherein the mask is removed before the second dopant is introduced, such that when the second dopant is introduced, the second dopant is also introduced into the mesa structures, and wherein, by means of the second thermal step, the second dopant introduced into the mesa structures is at least partly outdiffused in order to form body regions in the mesa structures.

* * * * *